(12) United States Patent
Tihanyi

(10) Patent No.: US 7,999,343 B2
(45) Date of Patent: Aug. 16, 2011

(54) SEMICONDUCTOR COMPONENT WITH A SPACE-SAVING EDGE TERMINATION, AND METHOD FOR PRODUCTION OF SUCH COMPONENT

(75) Inventor: Jenoe Tihanyi, Kirchheim (DE); Nada Tihanyi, legal representative, Kirchheim (DE)

(73) Assignee: Infineon Technologies AG, Munich (DE)

( * ) Notice: Subject to any disclaimer, the term of this patent is extended or adjusted under 35 U.S.C. 154(b) by 943 days.

(21) Appl. No.: 11/515,427

(22) Filed: Sep. 1, 2006

(65) Prior Publication Data
US 2007/0096172 A1 May 3, 2007

(30) Foreign Application Priority Data
Sep. 2, 2005 (DE) .................. 10 2005 041 838 U

(51) Int. Cl.
*H01L 31/00* (2006.01)
(52) U.S. Cl. .................. 257/452; 257/495; 257/496
(58) Field of Classification Search .................. 257/452, 257/495, 496
See application file for complete search history.

(56) References Cited

U.S. PATENT DOCUMENTS

| 6,873,012 B2 * | 3/2005 | Stecher et al. ............ 257/347 |
| 2005/0093062 A1 * | 5/2005 | Tihanyi ...................... 257/343 |

FOREIGN PATENT DOCUMENTS

| DE | 3832750 A1 | 3/1990 |
| DE | 10312911 A1 | 10/2004 |
| EP | 1394860 A2 | 3/2004 |
| WO | WO 00/38242 | 6/2000 |

OTHER PUBLICATIONS

Baliga, B. Jayant. *Power Semiconductor Devices*. Boston, PWS Publishing Company: 1996. pp. 81-110. (32 Pages).

* cited by examiner

*Primary Examiner* — Thien F Tran
(74) *Attorney, Agent, or Firm* — Maginot, Moore & Beck

(57) ABSTRACT

An arrangement for use in a semiconductor component includes a semiconductor body and an edge structure. The semiconductor body having a first face, a second face, a first semiconductor zone of a first conductance type, at least one second semiconductor zone of a second conductance type, and a semiconductor junction formed therebetween running substantially parallel to the first face. The edge structure is laterally adjacent to the second semiconductor zone and includes at least a first trench. The first trench extends in a vertical direction into the semiconductor body and is filled with a dielectric material. The edge structure further includes a third semiconductor zone of the second conductance type, which, at least partially, is adjacent to a face of the at least one trench which faces away from the first face. The edge structure further includes a fourth semiconductor zone of the first conductance type, which is more heavily doped than the first semiconductor zone, and is proximate to the first face.

19 Claims, 13 Drawing Sheets

A - A

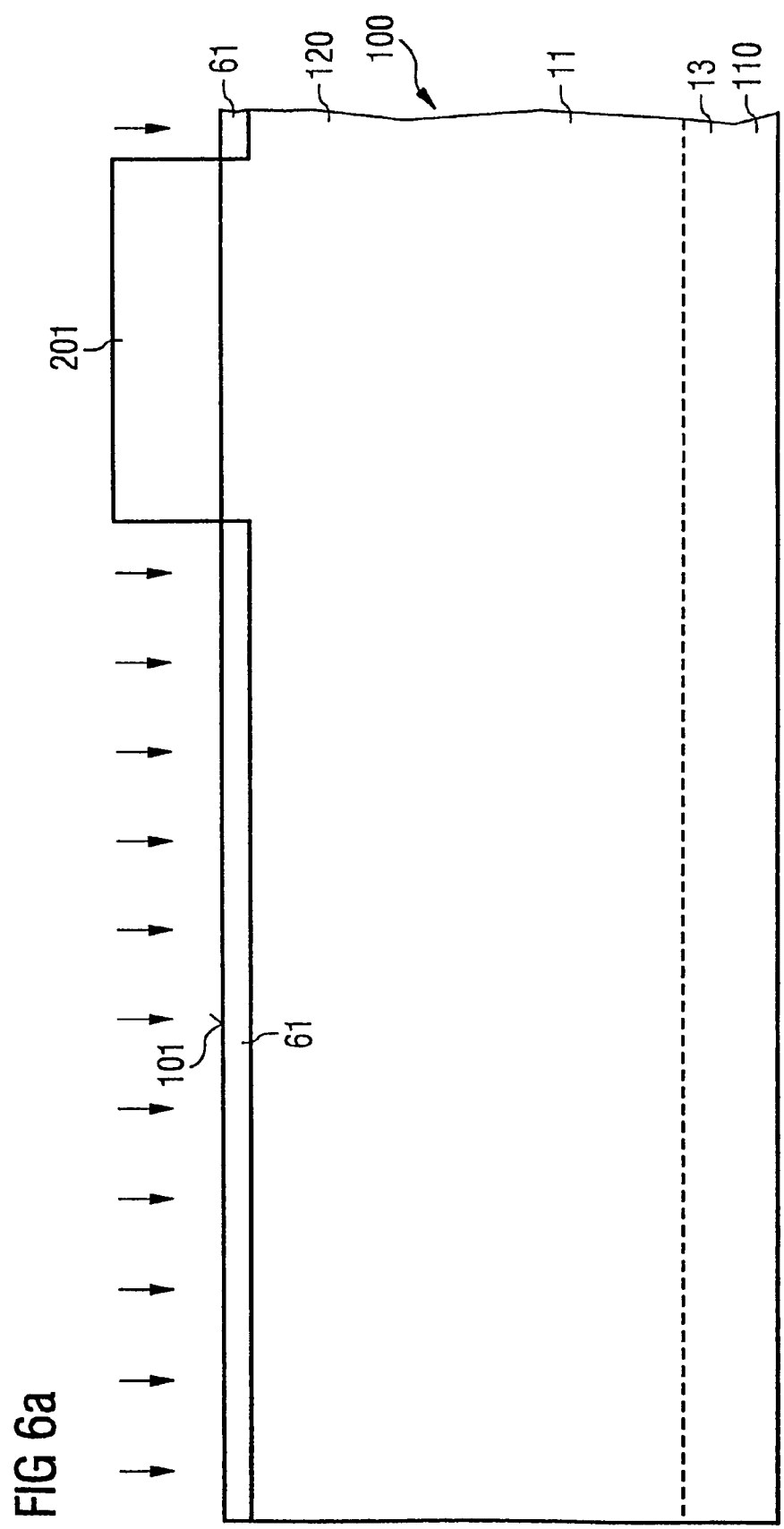

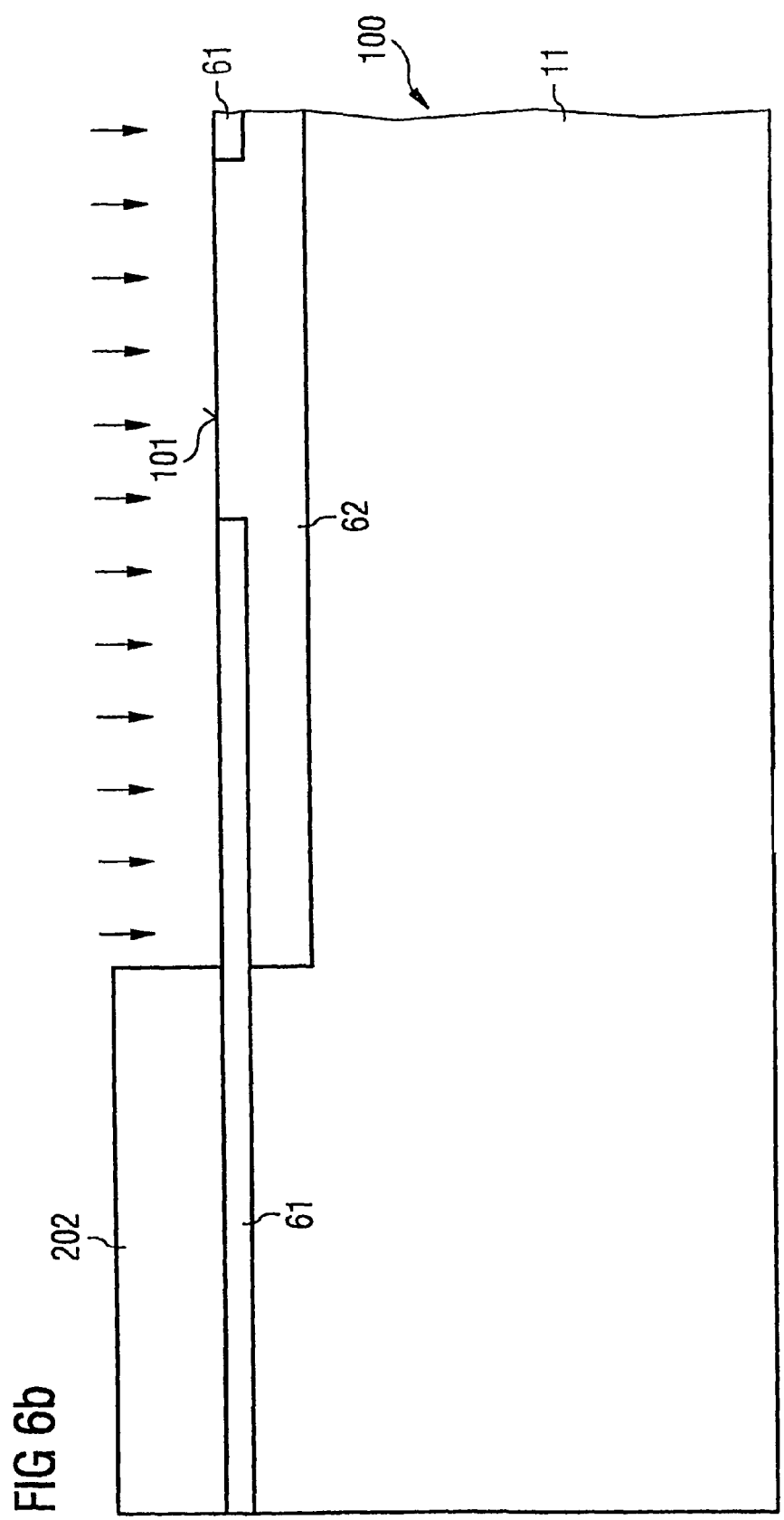

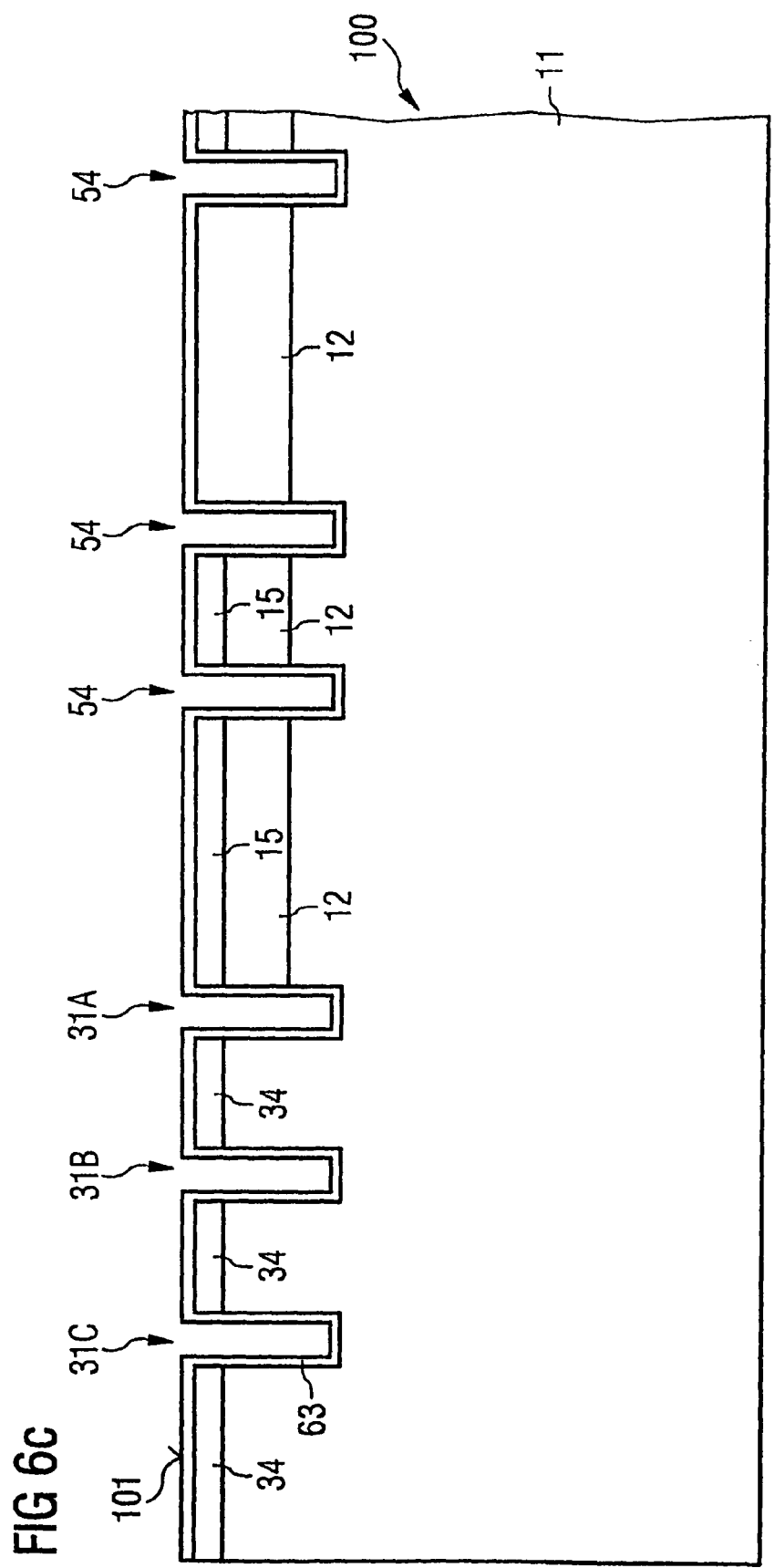

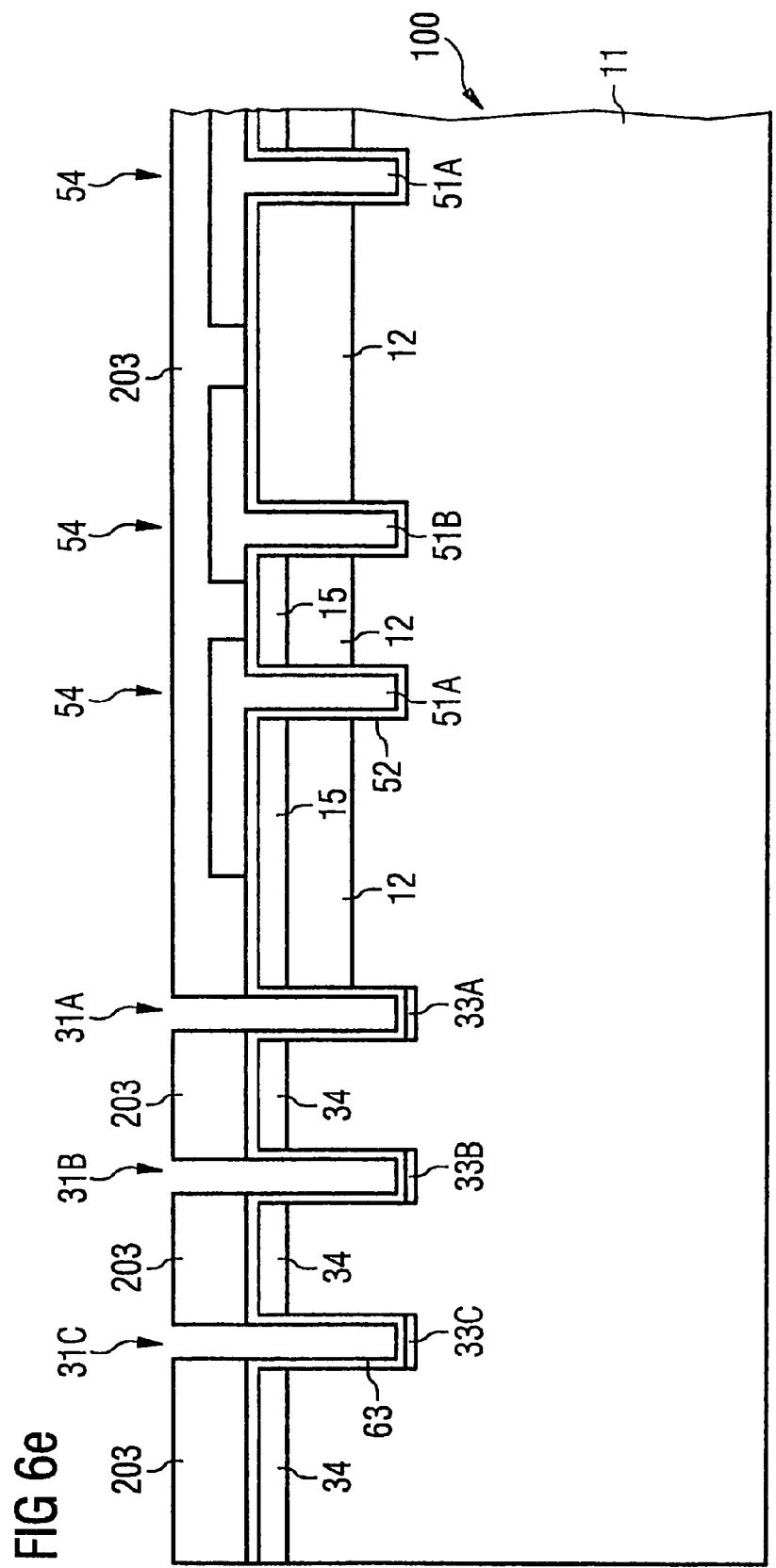

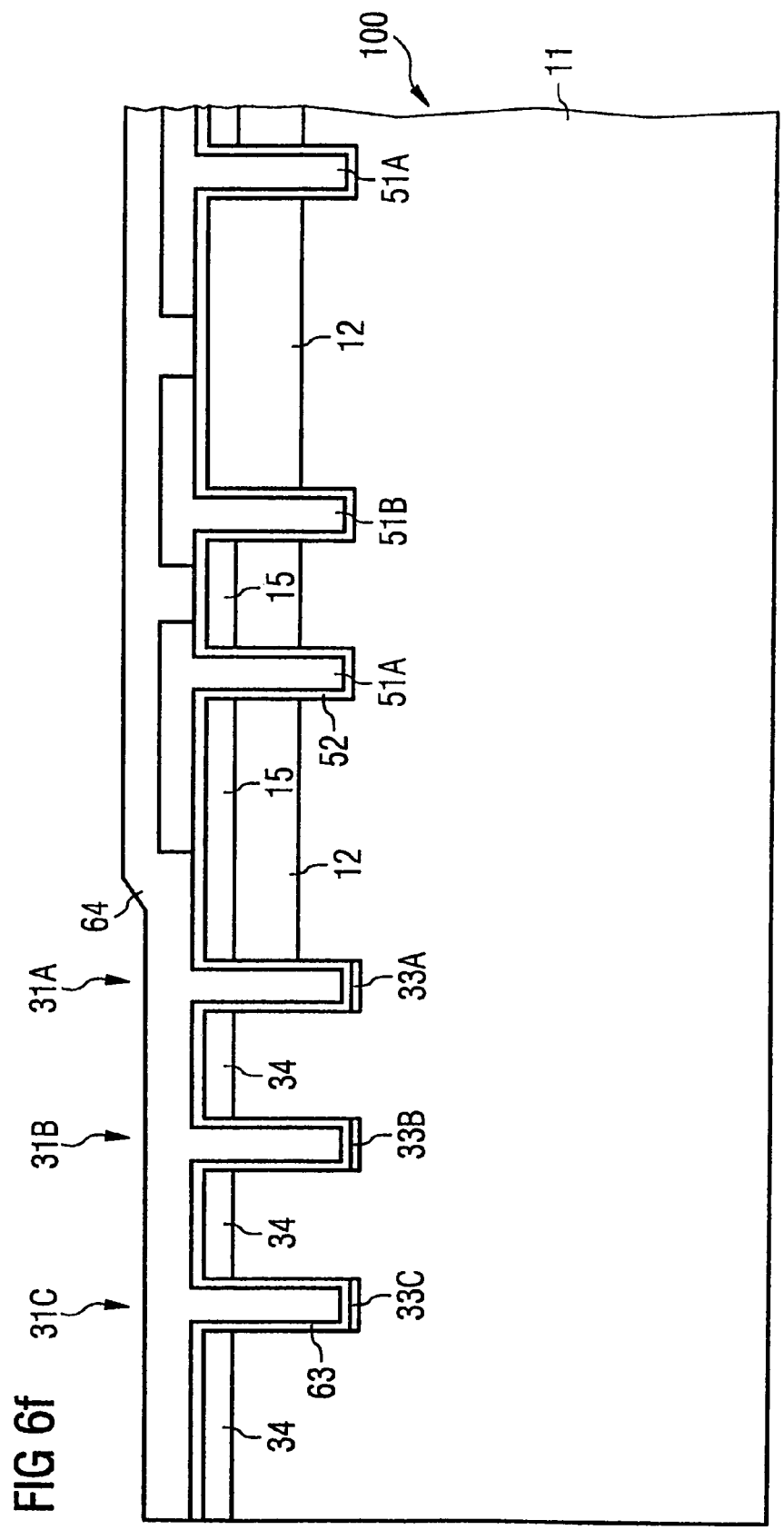

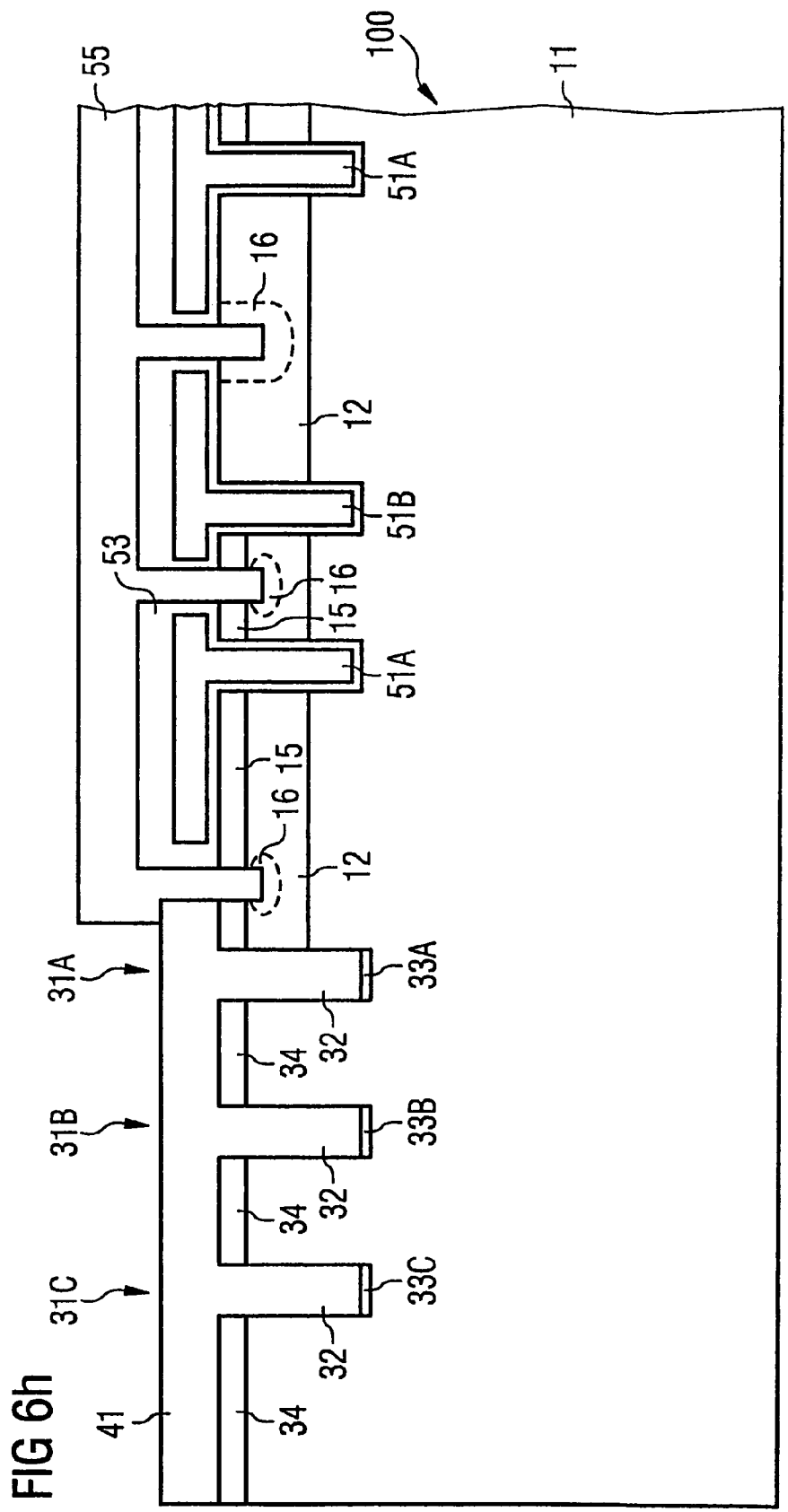

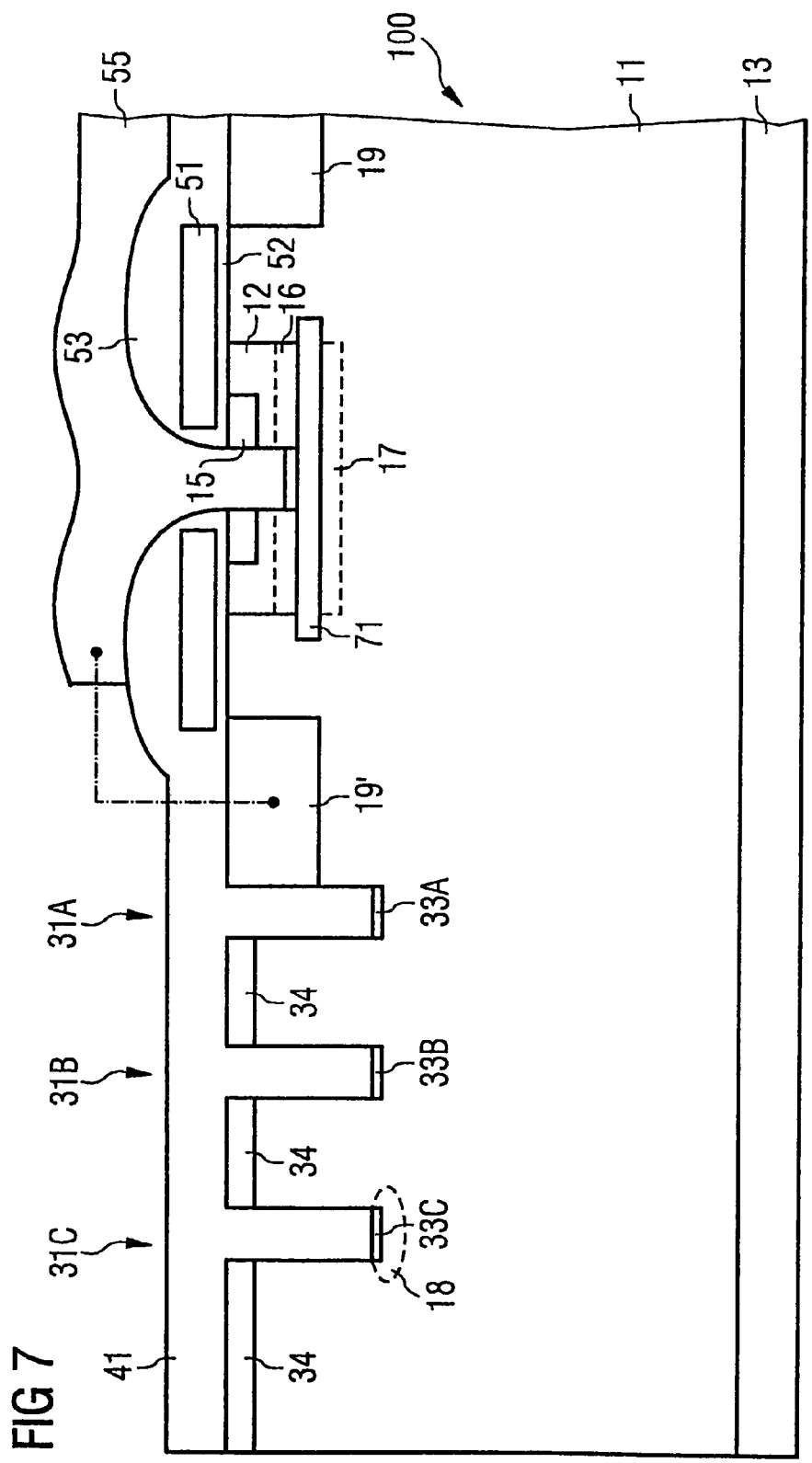

SEMICONDUCTOR COMPONENT WITH A SPACE-SAVING EDGE TERMINATION, AND METHOD FOR PRODUCTION OF SUCH COMPONENT

FIELD OF THE INVENTION

The present invention relates to a semiconductor component which has at least one first semiconductor zone of a first conductance type, and a semiconductor zone of a second conductance type, between which a semiconductor junction is formed, and in which an edge structure is arranged adjacent to the second semiconductor zone in a lateral direction, and which has at least one trench that is filled with a dielectric. The invention also relates to a method for production of a semiconductor component having an edge structure.

BACKGROUND

A component structure with a semiconductor junction, that is to say a pn junction, is used not only for bipolar components, such as diodes, bipolar transistors and IGBTs but also for unipolar components, such as MOSFETs. The behaviors of these components admittedly differ in the switched-on state and in the switched-off state, but these components have the common feature that a space-charge zone spreads out, starting from the reverse-biased semiconductor junction, as the blocking increases.

In the case of vertical components, this pn junction runs essentially parallel to one of the faces of the semiconductor body. Without additional measures, the withstand voltage in components such as these is reduced in those areas which are adjacent to the pn junction in the lateral direction. Normally, this is the edge area of the semiconductor body, that is to say the area which is arranged adjacent to an edge which runs in the vertical direction between a front face and a rear face of the semiconductor body. The area with the pn junction normally forms the inner area, whose area is larger than that of the edge area.

Widely differing edge terminations are known in order to increase the withstand voltage in the edge area and thus to achieve a voltage breakdown in the relatively large-area inner area by making a maximum reverse voltage. In the case of edge terminations such as these, which are described in detail in Baliga: "Power Semiconductor Devices", PWS Publishing, 1995, pages 81 to 110, a distinction is drawn between planar edge terminations and inclined edge terminations. Planar edge terminations comprise, for example, so-called doped field wings around the inner zone or field plates above the faces of the semiconductor body. Inclined edge terminations are formed by inclines on the edge. Planar and inclined terminations can be combined.

The object of edge terminations is to reduce the curvature of the profile of the field lines in the edge area and to reduce the field strengths which occur in the edge area, in comparison to the field strengths which occur in the inner area, when a reverse voltage is applied. Particularly planar edge terminations, which have the advantage over inclined terminations that they can be produced by means of conventional doping and cutting steps, are highly space-consuming, however. This means that they require a broad edge zone between the edge and the inner zone which is used for active component areas. As a result, a considerable proportion of the chip area is not available for active component areas.

WO 00/38242 A1 describes an edge termination which is arranged adjacent to a pn junction in a semiconductor body and has a trench which is filled with a dielectric and extends in the vertical direction into a semiconductor body, starting from a front face. In this case, the semiconductor body has basic doping of a first conductance type, and has an area of a second conduction type in the area of the front face, in order to form the pn junction. Starting from this area of the second conductance type, a more lightly doped area of the second conductance type extends in the lateral direction as far as the trench. This more lightly doped area optionally completely surrounds the trench.

DE 103 12 911 A1 describes a semiconductor component having an edge termination which is arranged adjacent to a pn junction in a semiconductor body. The pn junction is in this case filled between a first area, which has basic doping of a first conductance type, and a second area, which has doping of the second conductance type. The edge termination has at least one trench which extends into the semiconductor body starting from a front face and is filled with a dielectric. At least one third semiconductor zone of the second conductance type is provided adjacent to the trench, which is arranged in the first area.

Above the edge structure in the case of components such as these, a dielectric layer is normally applied to the face of the semiconductor body, starting from which the trench extends into the semiconductor body. This dielectric layer is used for passivation of the component. Ionization of atoms can occur during operation of the component, particularly in the area of the surface of this passivation layer. This has the disadvantage that the positively or negatively charged ions which result from it can influence the profile of the electrical field in the area of the edge structure located underneath it, and thus the withstand voltage of the component.

There is a need therefore, for a semiconductor component (and corresponding method of manufacture) with an edge structure which does not have the disadvantages mentioned above

SUMMARY OF THE INVENTION

At least some embodiments of the present invention address the above-stated need, as well as others.

A first embodiment is an arrangement for use in a semiconductor component that includes a semiconductor body and an edge structure. The semiconductor body having a first face, a second face, a first semiconductor zone of a first conductance type, at least one second semiconductor zone of a second conductance type, and a semiconductor junction formed therebetween running substantially parallel to the first face. The edge structure is laterally adjacent to the second semiconductor zone and includes at least a first trench. The first trench extends in a vertical direction into the semiconductor body and is filled with a dielectric material. The edge structure further includes a third semiconductor zone of the second conductance type, which, at least partially, is adjacent to a face of the at least one trench which faces away from the first face. The edge structure further includes a fourth semiconductor zone of the first conductance type, which is more heavily doped than the first semiconductor zone, and is proximate to the first face.

BRIEF DESCRIPTION OF THE DRAWINGS

The present invention will be explained in more detail in the following text with reference to the figures, in which:

FIG. 7 shows one exemplary embodiment of a semiconductor component according to the invention, in the form of an SOI-IGBT.

DETAILED DESCRIPTION

Figure 1:
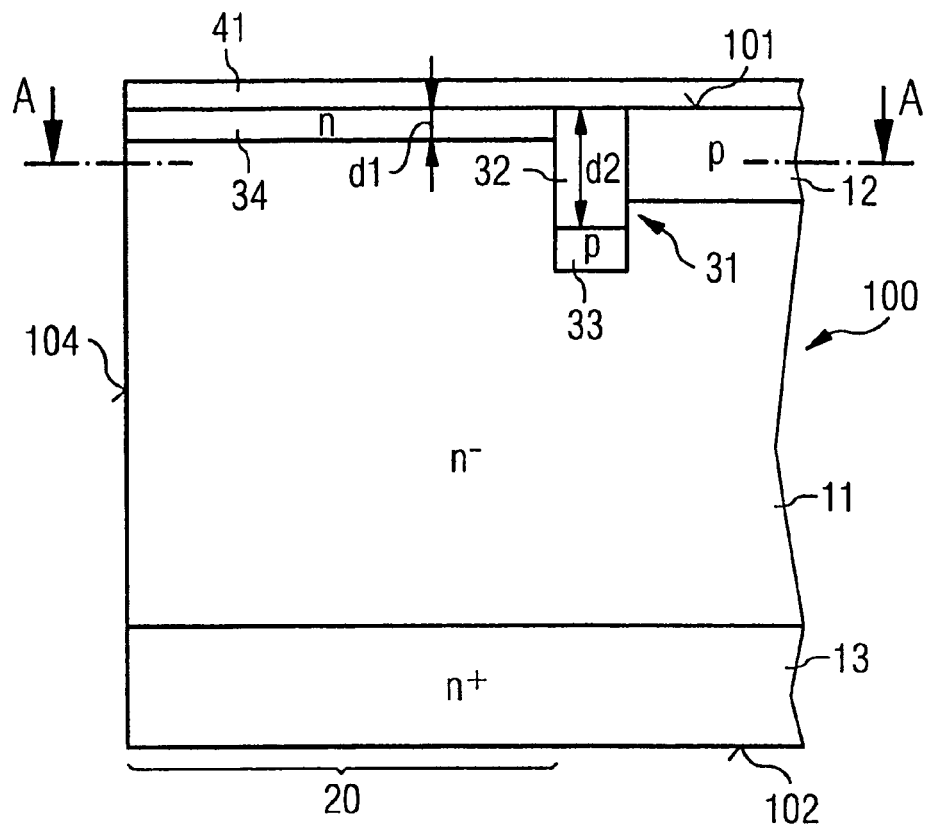
FIG. 1 shows a cross-sectional side view of a semiconductor component according to the invention, in the form of a diode.

Unless stated to the contrary, identical reference symbols denote identical component areas with the same meaning in the figures.

The semiconductor component according to at least one embodiment has a semiconductor body with a first and a second face, in which a first semiconductor zone of a first conductance type and at least one second semiconductor zone of a second conductance type are provided. A semiconductor junction is formed between the first and the second semiconductor zone, and runs parallel to the first face, at least in places. In the case of this component, an edge structure is arranged in the lateral direction of the semiconductor body adjacent to the second semiconductor zone, and has at least one trench which extends into the semiconductor body in the vertical direction in the first semiconductor zone, starting from the first face, and is filled with a dielectric material. Furthermore, the edge structure has a third semiconductor zone of a second conductance type, which is adjacent, at least in places, to a face of the at least one trench which faces away from the first face. Furthermore, a passivation layer is applied to the first face in the area of the edge structure. This passivation layer is composed, for example, of a dielectric material, which may correspond to the dielectric material in the at least one trench.

In order to avoid negative effects of ions, which may be formed on the surface of the passivation layer, on the profile of the electrical field in a semiconductor body, in particular in the area of the edge structure, during operation of the component, a fourth semiconductor zone of the first conductance type is provided in the edge structure in the area of the first face in the component according to at least some embodiments of the invention, and is more heavily doped than the first semiconductor zone. Ions which are formed in or on the passivation layer find an opposing charge in this heavily doped fourth semiconductor zone, and therefore do not influence the field profile in those areas of the edge structure which are located underneath this heavily-doped zone.

The heavily-doped fourth semiconductor zone is, for example, a semiconductor zone produced by means of ion implantation. The dopant dose for production of this fourth semiconductor zone is preferably more than $10^{13}$ cm$^{-2}$.

The semiconductor body has an edge which runs in the vertical direction between the first and the second face, in which case the edge structure may be arranged between the pn junction and the edge. However, the edge structure may also be used for isolation between a plurality of components which are integrated jointly in one semiconductor body and each have a pn junction. In this case, the edge zone is arranged between these component structures in the lateral direction, or the edge structure is arranged such that it completely surrounds at least one of these component structures in the lateral direction. This may be done by the at least one trench, with the dielectric arranged in it, surrounding the second semiconductor zone of one of these plurality of component structures in an annular shape.

The edge structure preferably comprises a plurality of trenches which are arranged at a distance from one another in the lateral direction of the semiconductor body, and a plurality of third semiconductor zones of the second conductance type, which are each adjacent to one of these trenches. The withstand voltage of the component in this case rises with the number of trenches which are provided for the edge structure. Just one trench may therefore be sufficient for a component with a withstand voltage of 50V, while for withstand voltages of up to 10 kV it may be necessary to provide up to 100 trenches of this type, with dielectric arranged in them.

If a plurality of trenches are provided, these are preferably arranged in such a manner that the distance between two adjacent trenches is less than the depth to which the trenches project into the semiconductor body in the vertical direction. The individual trenches preferably in this case each extend to the same extent into the semiconductor body in the vertical direction.

One embodiment of the invention provides that the at least one trench with the dielectric arranged in it is directly adjacent to the second semiconductor zone.

The edge structure with the at least one trench, the passivation layer and the heavily-doped fourth semiconductor zone is suitable for any desired bipolar and unipolar vertical components. In the case of a vertical diode, the first semiconductor zone forms a first emitter, and the second semiconductor zone forms a base zone of the diode. In the diode, a further semiconductor zone of the first conductance type is also provided adjacent to the first semiconductor zone, is more heavily doped than the first semiconductor zone, and forms a second emitter of the component.

In the case of an MOS transistor, the first semiconductor zone forms a drift zone of the component, and the second semiconductor zone forms a body zone. The MOS transistor also has a source zone of the first conductance type, with this source zone being isolated from the drift zone by the body zone. In the case of an MOS transistor, a drain zone is adjacent to that face of the drift zone which faces away from the body zone and, in the case of an MOSFET of the same conductance type as the drift zone, however more heavily doped, and in the case of an IGBT is doped in a complementary manner to the drift zone. A gate electrode is provided in order to control a conductive channel in the body zone between the source zone and the drift zone, is arranged adjacent to the body zone, and is isolated from the semiconductor body by means of a gate dielectric. In particular, this gate electrode may be arranged in a trench, which extends into the semiconductor body starting from the first face.

An exemplary method according to embodiments of the invention relates to a method for production of a semiconductor component having a trench-MOS-transistor structure, which has at least one gate electrode arranged in a trench, and having an edge structure as explained above. This method provides for the at least one trench in the edge structure to be produced together with the at least one trench in the MOS transistor structure, and from the fourth semiconductor zone of the edge structure to be produced together with the source zone of the MOS transistor structure.

FIG. 1 shows a side view of a detail of a cross section through a semiconductor body 100, in which a component structure for a vertical power diode and an edge structure 20 are arranged. The semiconductor body 100 has a first face 101, which is referred to in the following text as the front face, and a second face 102, which is opposite the first face 101 and is referred to in the following text as the rear face. An edge which runs in the vertical direction of the semiconductor body 100 and bounds the semiconductor body 100 in the lateral direction is annotated with the reference symbol 104 in FIG. 1.

The semiconductor body 100 has a first semiconductor zone 11 of a first conductance type, and a second semiconductor zone 12 of a second conductance type, between which a semiconductor junction or a pn junction is formed, which runs parallel to the front face 101 in places. The first semiconductor zone 11 is, for example n-doped and forms a base zone or drift zone of the power diode, while the second semiconductor zone 12 is, for example, p-doped and forms the p-emitter of the power diode. A further semiconductor zone 13 of the first conductance type, which is more heavily doped than the first semiconductor zone 11, is adjacent to a face of the first semiconductor zone 11 facing away from the second semiconductor zone 12. In the case of an n-doped base zone 11, this further semiconductor zone 13 forms the n-emitter of the vertical power diode, in which a charge carrier flow takes place between the p-emitter 12 and the n-emitter 13 in the vertical direction of the semiconductor body 100 when a field-biased voltage is applied.

The edge structure 20 is arranged adjacent to the second semiconductor zone 12 in the lateral direction of the semiconductor body 100, and has at least one trench 31, which extends in the vertical direction into the semiconductor body 100 starting from the first face 101, and is filled with a dielectric 32. This trench 31 together with the dielectric 32 arranged in it is preferably directly adjacent in the lateral direction to the second semiconductor zone 12. Starting from the front face 101, the trench 31 extends into the first semiconductor zone 11, whose doping is of the first conductance type, with a third semiconductor zone 33 of the second conductance type being provided underneath the trench 31, and being adjacent to the trench 31, which is filled with the dielectric 32. This third semiconductor zone 33 is arranged exclusively underneath the trench 31 in the example shown in FIG. 1, but can also be arranged in places at the side alongside the trench 31 for the dielectric 32, in a manner which is not illustrated in any more detail.

The edge structure 20 also has a fourth semiconductor zone 34 of the first conductance type, which is more heavily doped than the first semiconductor zone 11, is adjacent to the trench 31, which is filled with the dielectric 32 in the lateral direction, and is arranged in the area of the front face 101 of the semiconductor body 100. This fourth semiconductor zone 34 is preferably directly adjacent to the front face 101 of the semiconductor body 100. A dimension d1 of this fourth semiconductor zone 34 in the vertical direction in the semiconductor body 100 is preferably considerably less than the depth d2 to which the trench 31 extends into the semiconductor body 100 in the vertical direction, starting from the front face 101.

In addition, the edge structure 20 has a passivation layer 41, which is applied to the front face 101 of the semiconductor body, at least in the area of the edge structure.

In the example shown in FIG. 1, the edge structure 20 is arranged between the second semiconductor zone 12 and the vertical edge 104 of the component. In this context, it should be noted that the edge structure need not, however, necessarily be arranged in the vicinity of the edge of the semiconductor body 100 but that, in fact, the edge structure 20 can be used such that it is arranged in the "edge area" of an active component structure, in order to influence the profile of an electrical field which originates from the active component structure. In the case of the component shown in FIG. 1, the active component structure is formed by the second semiconductor zone 12, that section of the first semiconductor zone 11 which is adjacent to this second semiconductor zone, and the further semiconductor zone 13.

Figure 2:
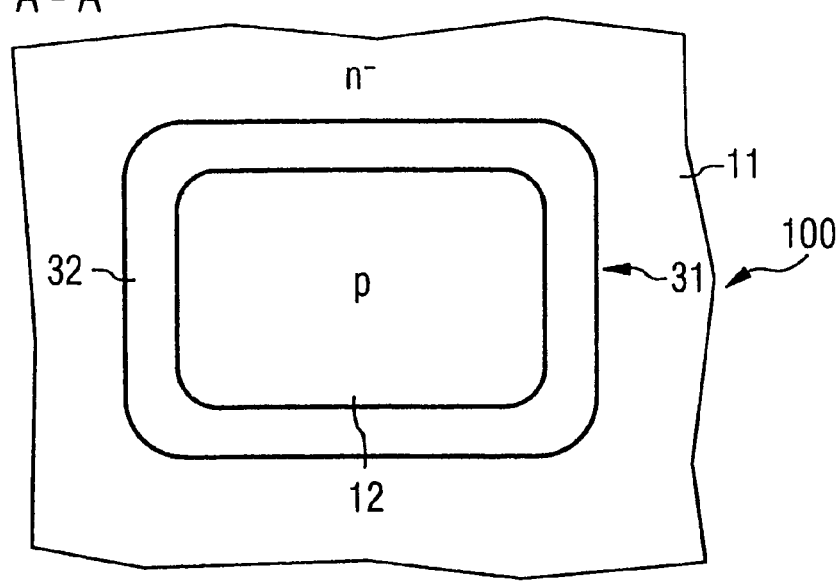
FIG. 2 shows a cross section through the component shown in FIG. 1, on the section plane A-A shown in FIG. 1.

With reference to FIG. 2, which shows a cross section through the component as shown in FIG. 1 along the section plane A-A, the edge structure 20 surrounds this active component area in annular shape in the lateral direction, that is to say the trench 31 which is filled with the dielectric 32 surrounds the second semiconductor zone 12 in an annular shape. The trench 31 with the dielectric 32 arranged in it in this case preferably extends deeper into the semiconductor body 100 in the vertical direction than the second semiconductor zone 12.

In a manner which is not illustrated in any more detail, it is possible to provide a plurality of active component areas in one semiconductor body, and to surround these active component areas with the illustrated edge structure in an annular shape, or to isolate two adjacent active component areas by means of the edge structure.

By way of example, the passivation layer 41 is composed of a dielectric material, for example a semiconductor oxide. This dielectric material of the passivation layer 41 may in this case be the same dielectric material as the dielectric material with which the at least one trench 31 of the edge structure 20 is filled.

Figure 3:
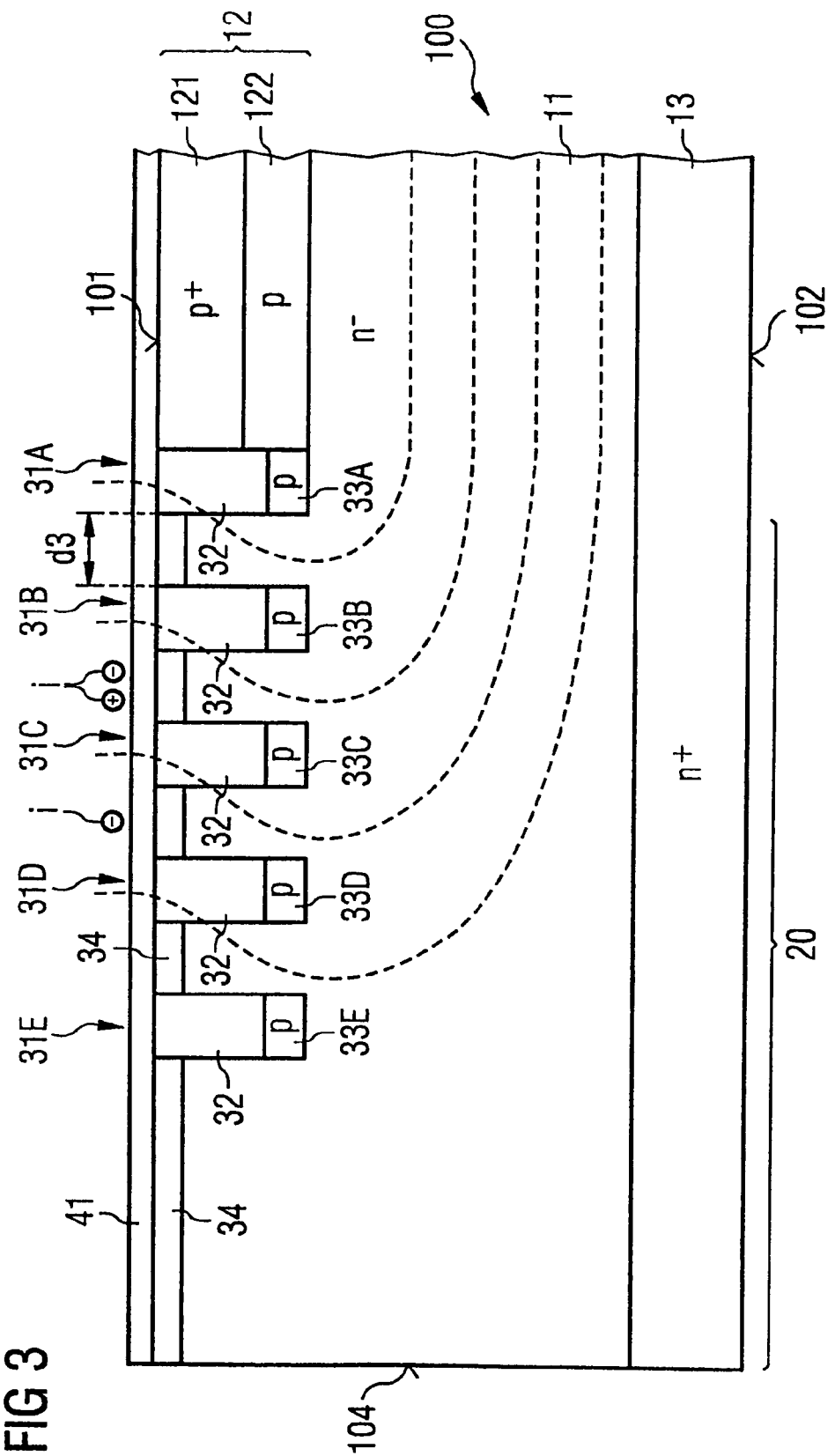
FIG. 3 shows a further exemplary embodiment of a semiconductor component according to the invention, which is in the form of a diode and has an edge structure with a plurality of trenches.

FIG. 3 shows a further exemplary embodiment of a semiconductor component in the form of a power diode. The component shown in FIG. 3 differs from the component illustrated in FIG. 1 in that the edge structure 20 has a plurality (in the example five) of trenches 31A-31E which are filled with a dielectric 32. In this case, the edge structure has a number of third semiconductor zones 33A-33E corresponding to the number of trenches, and these are each doped in a complementary manner to the first semiconductor zone 11, with each of them having a face, which faces away from the front face 101, adjacent to one of the trenches 31A-31E. The individual trenches 31A-31E are each arranged at a distance from one another in the lateral direction of the semiconductor body 100, with the separation d3 between two mutually adjacent trenches, for example the trenches 31A, 31B, preferably being less than the depth to which the trenches 31A-31E extend in the vertical direction into the semiconductor body 100.

In the example shown in FIG. 3, the edge structure 20 is likewise arranged between the active component structure with the pn junction and the vertical edge 104, with an "innermost" one of these trenches 31A-31E being directly adjacent to the second semiconductor zone 12. The fourth semiconductor zone 34 in this case extends to the edge 104, starting from this innermost trench 31A, and is in this case interrupted only by the further trenches 31B-31E.

The second semiconductor zone 12 in this example has first and second zone elements 121, 122, of which the first zone element 121 is more heavily doped than the second zone element 122, and of which the second zone element 122 is adjacent to the first semiconductor zone 11. The more heavily doped first zone element 121 is directly adjacent to the front face 101 of the semiconductor body 100, and makes contact with a connection electrode there, in a manner which will not be described in any more detail, at a position at a distance from the area illustrated in FIG. 3. The subdivision of the p-emitter 12 into two differently doped zones carries out two functions. Firstly, the contact resistance between this connection electrode and the second semiconductor zone 12 is reduced by the more heavily doped zone 121 which makes contact with the connection electrode (not illustrated). Secondly, the emitter efficiency, that is to say the ratio of the hole current to the electron current, can be set by the doping level of the more heavily doped zone 121. This makes it possible to set the switching power loss of the component.

The method of operation of the edge structure of the component according to the invention will be explained in the following text with reference to the component that is illustrated in FIG. 3 and has a power diode structure. This explanation is based on the assumption that the first semiconductor zone 11, which forms the base of the power diode, is n-doped. In a corresponding manner, the second semiconductor zone 12, which forms the p-emitter, is p-doped, and the further semiconductor zone 13, which forms the n-emitter of the component is n-doped. When a reverse voltage is applied to the component, that is to say where positive voltage is applied between the n-emitter 13 and the p-emitter 12, a space-charge zone is formed, starting from the pn-junction, in the base 11, which is lightly doped in comparison to the p-emitter 12, and this space-charge zone spreads out in the direction of the n-emitter 13 as the reverse voltage increases. FIG. 3 shows equipotential lines of this space-charge zone schematically, as dashed lines. Field lines of the electrical field which is connected to the space-charge zone in this case each run (which is not illustrated in any more detail) at right angles to these equipotential lines. In a section of this pn junction which is not illustrated in more detail but is at a distance from the pn junction which is at a distance from the edge structure, the equipotential lines run approximately parallel to the pn junction which, by virtue of the geometry of the second semiconductor zone 12, in turn runs parallel to the front face and the rear face 101, 102 of the semiconductor body 100. The field lines of the electrical field run in the vertical direction of the semiconductor body 100, in this area.

The object of the edge structure 20 is to influence the profile of the electrical field in the area which is adjacent to the pn junction in the lateral direction in such a way that the electrical field strength in this area is always less than in the "inner area", in which the field lines run in the vertical direction. This means that, when a reverse voltage which is above the breakdown voltage of the component is applied, the voltage breakdown occurs in the inner area of the component, whose area is larger, but which is not illustrated in any more detail. Another object of the edge structure 20 is to influence the electrical field in the area of the n structure 20 such that the field lines run at least approximately parallel to the surface of the semiconductor body, in the illustrated example at least approximately parallel to the front face 101, in the area in which the electrical field emerges from the semiconductor body 100. This is thus equivalent to the equipotential lines running at right angles to the front face 101 of the semiconductor body.

The edge structure 20 thus results in the electrical field being "rotated" from a vertical orientation in the area of the pn junction at a distance from the edge structure 20, to a lateral orientation in the area in which the electrical field emerges from the front face 101. Furthermore, the edge structure 20 ensures that the electrical field strength in the area of the edge structure 20 is less than in the area of the pn junction at a distance from the edge structure 20, as is shown in the illustration in FIG. 3 by the fact that the distance between the equipotential lines in the area of the edge structure 20 is greater than the distance between the equipotential lines in the "inner area".

The object of the third semiconductor zones 33A-33E is to assist the "rotation" of the electrical field in the edge area. If these third semiconductor zones 31A are covered by the space-charge zone as it spreads out, they are kept at a potential which corresponds to the potential of the space-charge zone at this point and, starting from these third semiconductor zones 33A-33E, further space-charge zones spread out in the first semiconductor zone 11, resulting in the equipotential lines having the curved profile illustrated in FIG. 3.

The heavily-doped fourth semiconductor zone 34 results in ionized atoms which are created on or in the passivation layer 41, are illustrated schematically in FIG. 3 and are annotated with the reference symbol i, finding an opposite charge in this heavily-doped semiconductor zone 34. These ions thus have no influence on the profile of the electrical field in the area of the edge structure 20. Ions such as these are mainly protons and alkali ions, such as sodium. Sodium is an impurity which is always present in semiconductor components, which is introduced during the production process or is applied to the surface of the component during its assembly. At temperatures of 100° C., sodium ions can diffuse through oxides in the electrical field. Protons are likewise introduced into the passivation layer during the production process.

Figure 4:
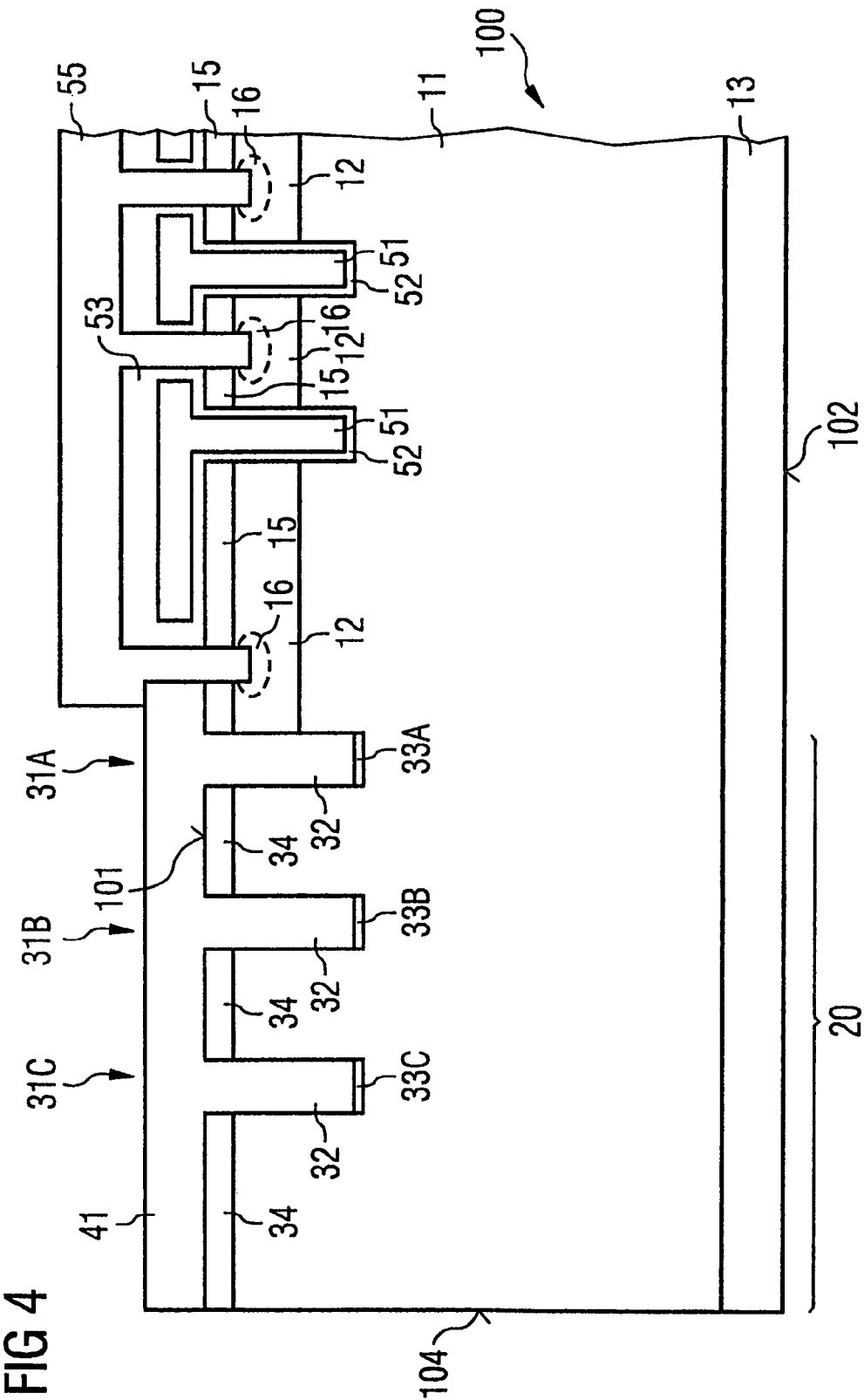
FIG. 4 shows a cross-sectional side view of a semiconductor component according to the invention, in the form of a trench-MOS transistor.

FIG. 4 shows a cross section through a semiconductor component according to another embodiment of the invention, which has a trench-MOS transistor structure and an edge structure 20 that has already been explained above. In the example, the edge structure 20 has three trenches 31A-31C, which are filled with a dielectric 32. The dielectric with which the trenches 31A-31C are filled also extends over the front face 101 of the semiconductor body 100 above the trench structure, where it forms the passivation layer 41.

The trench-MOS transistor structure has a drift zone which is formed by the first semiconductor zone 11. The second semiconductor zone 12, which is adjacent to the first semiconductor zone 11 in the direction of the front face 101, forms a body zone of the transistor structure. In the direction of the front face 101, the body zone 12 is adjacent to a source zone 15, with complementary doping to that of the body zone, with the body zone 12 separating the source zone 15 and the drift zone 11. Gate electrodes 51 are used to form a conductive channel in the body zone 12 between the source zone 15 and the drift zone 11 and are arranged in trenches which, starting from the front face 101, extend through the source zone 15 and the body zone 12 into the drift zone 11. In this case, the gate electrodes 51 are isolated from the semiconductor body 100 by means of a gate dielectric 52. A source electrode 55, which is isolated from the gate electrodes 51 by means of an isolation layer or dielectric layer 52, makes contact with the source zone 15, with the source electrode 55 extending in places preferably into the body zone 12, in order to short-circuit the source zone 15 and the body zone 12. A heavily-doped connection zone 16 of the second conductance type, that is to say of the same conductance type as the body zone 12, is optionally provided in the areas in which the source electrode 55 makes contact with the body zone 12.

The transistor structure illustrated in FIG. 4 is cellular, that is to say a large number of gate electrodes or gate electrode sections are provided, which are each electrically conductively connected to one another in a manner which will not be described in any more detail, and each extend in the vertical direction into the semiconductor body 100, starting from the front face 101. One body zone 12, which is arranged in the lateral direction between two adjacent gate electrodes, is in this case connected to the source electrode 55.

FIG. 4 shows only one "edge area" of this transistor cell array with two gate electrodes 51. These gate electrodes 51 can be formed such that they run at right angles to the plane of the drawing illustrated in FIG. 4, in particular in the form of strips, in order to form "strip cells" in the transistor cell array. It should be noted that, however, the transistor cells may have any desired cell geometries which are suitable for cellular power transistors.

The body zone 12 preferably extends from the gate electrode 51 that is most directly adjacent to the edge structure 20, to as far as the trench 31A in the edge structure 20, which is arranged closest to the transistor structure and is filled with the dielectric 32. The source electrode 55 also makes contact with that section of the body zone 12 which is located in this intermediate area between the edge structure 20 and the transistor structure, with the contact preferably being arranged closer to the dielectric trench 31A than to the gate electrode which is located adjacent to this dielectric trench 31A. Furthermore, the gate electrode 51 of the trench which is most directly adjacent to the edge structure 20 may also extend somewhat in the direction of the edge structure 20 above the front face 101 of the semiconductor body 100.

The transistor structure illustrated in FIG. 4 may be either the transistor structure of an MOSFET, or the transistor structure of an IGBT. In the case of a MOSFET, a more heavily doped semiconductor zone 13 of the same conductance type as the drift zone 11 is adjacent to the drift zone 11 and forms the drain zone of this MOSFET. In the case of an n-MOSFET, the drift zone 11, the drain zone 13 and the source zone 15 are n-doped, and the body zone 12 is p-doped. In the case of a p-MOSFET, these component zones are doped in a correspondingly complementary manner. In the case of an IGBT, a connection zone 13 which is doped in a complementary manner to the drift zone 11 is adjacent to it and forms the drain zone or one of the emitters of the IGBT. In the case of an IGBT, the drift zone 11 is normally n-doped, so that the source zone 15 is likewise n-doped, and the body zone 12 and the connection zone 13 are p-doped.

When a positive voltage is applied between the drain zone 13 and the source zone 15 of the source electrode 55, a current flows in the vertical direction in the illustrated component, provided that the gate electrode 51 is driven in such a manner that a conductory channel is formed in the body zone 15 along the dielectric layer 52. If no such drive potential is available for the gate electrode 51, then the pn junction between the body zone 12 and the drift zone 11 is reverse-biased, thus resulting in a space-charge zone being formed in the drift zone 11, in the manner which has already been explained with reference to FIG. 3. When reverse-biased, the component illustrated in FIG. 4 thus acts in the same way as the diode illustrated in FIG. 3.

Figure 5:
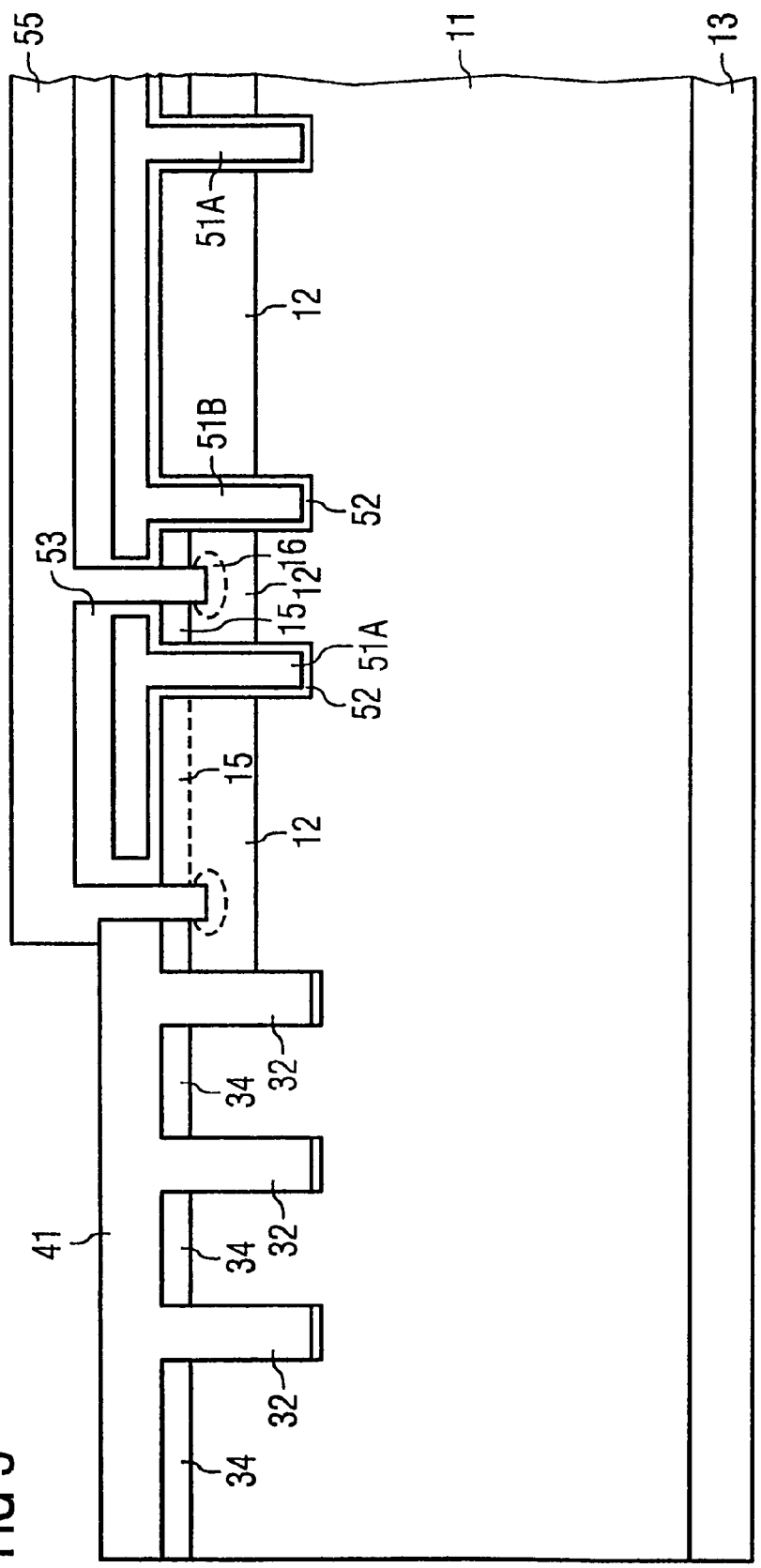
FIG. 5 shows a further exemplary embodiment of a semiconductor component in the form of a trench-MOS transistor.

FIG. 5 shows a cross section through a semiconductor component according to the invention, which has a trench transistor structure modified in comparison to the component shown in FIG. 4. In this component, the distance between adjacent trenches with gate electrodes arranged in them varies. Two such gate electrodes 51A, 51B in each case form a gate electrode pair, the distance d4 between which in the lateral direction is less than the distance D5 to the gate electrodes of an adjacent gate electrode pair. In this component, a source zone 15 is provided only in the area between the gate electrodes 51A, 51B of one gate electrode pair, so that a conductive channel between the drift zone 11 and the source zone 15 can be formed only in the body zone 12 between these gate electrodes 51A, 51B. In this case, the source electrode 55 makes contact with the body zone 12 only in the area between two adjacent gate electrodes 51A, 51B of a gate electrode pair, and not in the broader area between two adjacent electrode pairs.

A method for production of a semiconductor component will be explained in the following text with reference to FIG. 6, with this semiconductor component having a trench transistor structure and an edge structure according to the invention. Major aspects of this method comprise the fourth semiconductor zone of the edge structure being produced together with the source zone of the MOS transistor structure, and the trenches of the edge structure being produced together with the trenches for the gate electrodes of the transistor structure.

FIG. 6a shows the semiconductor body 100 during first method steps for production of the component. During these method steps, dopant atoms of the first conductance type are implanted in the semiconductor body 100 via the front face 101, in order to produce a semiconductor zone 61 of the first conductance type in the area of the front face 101. This semiconductor zone 61 forms the fourth semiconductor zone of this edge structure in the area of the subsequent edge structure, and forms the source zone of the transistor structure in the area of the subsequent transistor structure.

In order to produce a component as shown in FIG. 5, in which no source zone is provided in places in the area of the transistor structure, the dopant atoms are implanted in a masked manner using a mask 201 which is applied to the front face 101 and covers those areas of the semiconductor body 100 in which no source zone is intended to be produced.

There is no need for a mask such as this in order to produce a component as shown in FIG. 4, which has a large number of identical transistor cells each having one source zone.

The semiconductor body 100 may have basic doping throughout, corresponding to the doping of the first semiconductor zone 11. Furthermore, it is possible to produce a semiconductor body 100 which has a heavily-doped first semiconductor layer 110, for example a semiconductor substrate, and a more lightly-doped semiconductor layer 120, for example an epitaxial layer, applied to this heavily-doped semiconductor layer 110, as is illustrated by dashed lines in FIG. 6a. The heavily-doped first semiconductor layer 110 in this case forms the subsequent drain zone of the component, while the more lightly-doped second semiconductor layer forms the subsequent drift zone for the component.

For the further method steps, it should first of all be assumed that the semiconductor body 100 has, throughout it, a basic doping of the first conductance type corresponding to the doping of the first semiconductor zone 11 or drift zone.

FIG. 6b shows the semiconductor body 100 during the next method steps, in which dopant atoms of the second conductance type are implanted, masked by the use of a second mask 202, over the front face 101 in the semiconductor body, in order to produce a semiconductor zone 62 of the second conductance type, which forms the subsequent body zone (12 in FIGS. 4 and 5) of the transistor structure. In this case, the mask 202 covers the area of the subsequent edge structure (20 in FIGS. 4 and 5) in order to prevent the production of a semiconductor zone of the second conductance type such as this there.

With regard to the implantation methods illustrated schematically in FIGS. 6a and 6b, it should be noted that the implantation of the dopant atoms is followed by a temperature step, in order to activate the implanted dopant atoms or dopant ions, and in order to ensure that the implanted dopant atoms diffuse to a desired depth, if required, into the semiconductor body 100.

FIG. 6c shows the semiconductor body 100 after further method steps, in which, starting from the front face 101, trenches 31A-31C are produced in the area of the subsequent edge structure, and trenches 54 are produced in the area of the transistor structure, and in which a dielectric layer 63 is deposited on the front face 101 and on side walls and on bottom surfaces of these trenches 31A-31C, 54. This dielectric layer 63 forms the gate dielectric in the trenches 54 of the subsequent transistor structure. By way of example, the dielectric layer 63 is composed of a semiconductor oxide, which is produced by thermal oxidation of the semiconductor body or by deposition of an oxide, for example TEOS (tetraethoxysilane).

The trenches are produced in a known manner using a masked anisotropic etching method. These trenches 31A-31C and 54 subdivide the semiconductor zone arranged underneath the front face 101 and of the first conductance type (64 in FIG. 6b) into a plurality of semiconductor zones which form the fourth semiconductor zone 34 of the edge structure in the area of the edge structure, and form the source zones 15 in the area of the transistor structure.

Figure 6D:
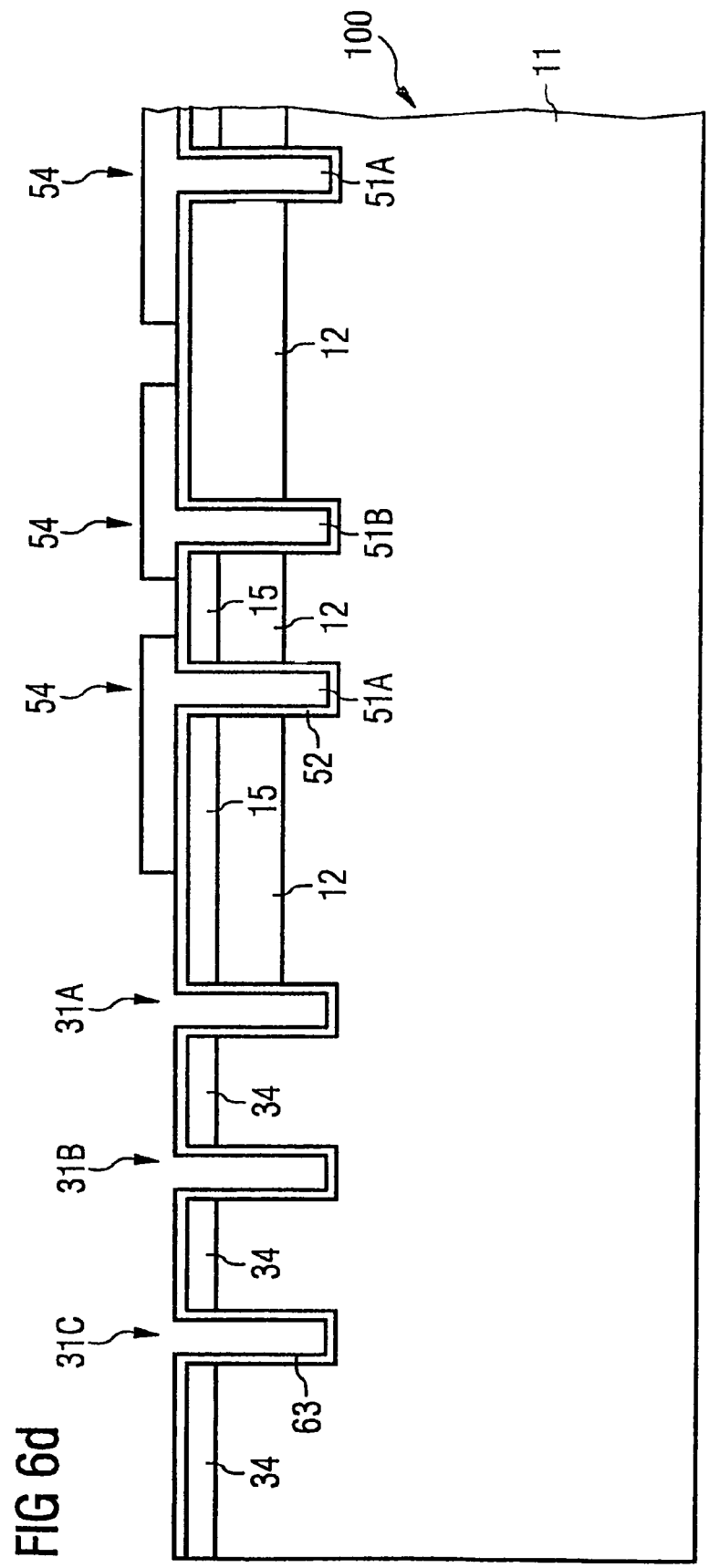
FIG. 6 shows the semiconductor component shown in FIG. 5 during individual method steps for production of this component.

FIG. 6d shows the semiconductor body 100 after further method steps, in which gate electrodes 51A, 51B have been produced in the trenches 54 in the area of the transistor structure. These gate electrodes are produced, for example, by deposition of an electrode layer over the entire area, for example composed of a heavily-doped polysilicon, on the front face 101 of the semiconductor body, and subsequent structuring of the electrode layer. The electrode layer is structured in such a manner that the electrode layer is removed from the trenches 31A-31C in the area of the edge structure, and is removed from the dielectric layer 63 above the front face. In the area of the transistor structure, the electrode layer is structured in such a manner that cutouts are formed above the front face 101 and allow contact to be made between the source zone or body zone and a source electrode, which has not yet been produced, as the process continues further. The electrode layer is structured in a manner which will not be described in any more detail by application of a mask to those areas of the electrode layer which are not intended to be removed, and then carrying out an anisotropic etching process, in which the dielectric layer 63 is used as an etching stop layer.

FIG. 6e shows the semiconductor body 100 during further method steps, in which dopant atoms of the second conductance type are implanted via the trenches 31A-31C in the edge structure into the semiconductor body 100 in order in this way to produce the third semiconductor zones 33A-33C of the second conductance type in the areas underneath these trenches 31A-31C. During this implantation process, a mask 203 protects those areas of the semiconductor body in which no implantation is intended to be carried out.

In a manner which will not be described in any more detail, it is also possible to carry out the trench etching in two stages, by first of all producing the trenches 31A-31C in the edge area, and by then implanting the dopant atoms in the trenches 31A-31C in the edge area. Only then are the trenches 54 for the transistor structure produced, using a further mask.

FIG. 6f shows the semiconductor body 100 after further method steps, in which a further dielectric layer 64 is applied after removal of the mask 203, fills the trenches 31A-31C of the subsequent edge structure, covers the front face 101 in the area of the edge structure and, furthermore, covers the gate electrodes 51A, 51B in the area of the transistor structure.

In the area of the transistor structure, this dielectric layer 64 forms the isolation layer between the gate electrodes 51A, 51B and the subsequent source electrode, and, in the area of the edge structure, forms the dielectric which fills the trenches 31A-31C, and the passivation layer.

The material for the dielectric layer 63 which is deposited first of all and forms the gate dielectric 52, and for the subsequently deposited dielectric layer 64 may be identical, thus creating a continuous dielectric layer in the area of the edge structure, which fills the trenches 51A-51C and forms the passivation layer 41. This is used as the basis for the following description, so that a continuous dielectric layer 32, 41 is illustrated in the following figures, in the trenches 31A-31C of the edge structure and in the area above the front face 101.

Figure 6G:
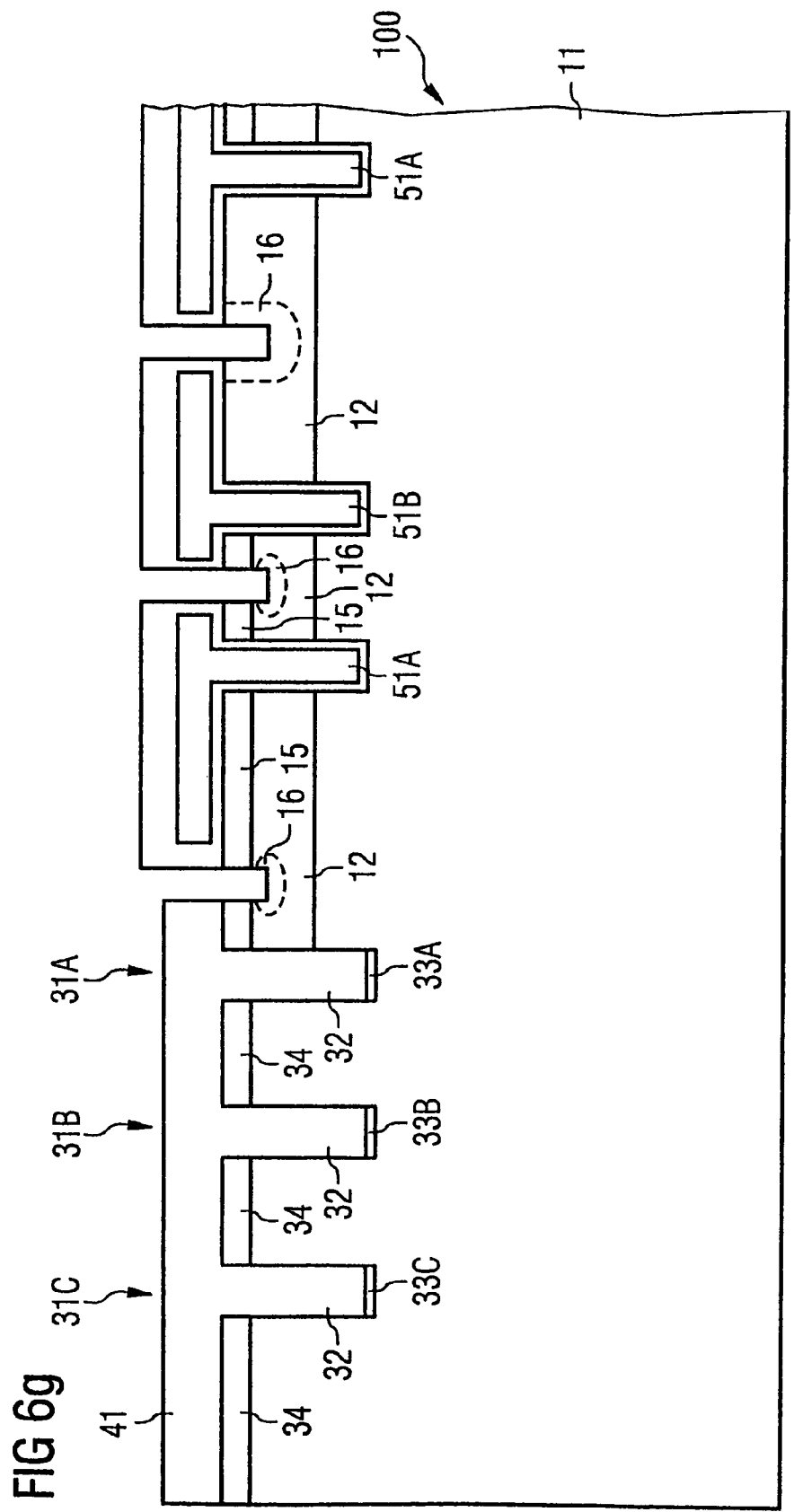

FIG. 6g shows the semiconductor body after further method steps, in which, in the area of the transistor structure, contact holes are etched through the dielectric layer 64 and through the source zone 15 into the body zone 12.

An electrode layer is then applied and structured, in order to form the source electrode 55 of the component, the result of which is illustrated in FIG. 6h.

Further method steps are required for a semiconductor body 100, which has uniform basic doping at the start of the method with this doping corresponding to the first semiconductor zone 11, in order to produce the heavily-doped connection zone in the area of the rear face of the semiconductor body, thus resulting in the component as shown in FIG. 4 or FIG. 5. This heavily-doped connection zone 13 may, for example, be produced by ion implantation via the rear face, in which case the semiconductor body 100 may be thinned or etched back, preferably starting from the rear face, before implantation of this connection zone.

With reference to FIG. 7, the edge structure which has been explained with reference to the previous figures can also be applied to power semiconductor components which have a so-called SOI-IGBT structure. In the case of these components, an isolation layer 71 or dielectric layer is arranged between the drift zone 11 and the body zone, and is used to control and to guide the flow of holes from the drift zone 11 into the body zone.

FIG. 7 shows one cell of an SOI-IGBT structure such as this. This transistor cell has a planar structure, that is to say a gate electrode 51 is arranged above the front face 101 of the semiconductor body, and is separated from the semiconductor body 100 by the gate dielectric 52. The body zone 12 extends in places, adjacent to the source zone 15, to the front face 101 of the semiconductor body 100. The drift zone 11 likewise extends in places to this front face 101, so that, when a suitable drive potential is applied to the gate electrode 51, a conductive channel is formed in the body zone 12, in the lateral direction underneath the front face 101 of the semiconductor body. An isolation layer 71 is provided underneath the body zone 12, and its dimensions in the latter direction are preferably greater than the dimensions of the body zone 12, so that holes from the drift zone 11 can enter the body zone 12 only from the lateral direction. This means that the hole concentration is increased, particularly in the area of the accumulation channel which is formed in the body zone, thus reducing the switch-on resistance. A semiconductor zone 16 of the second conductance type, which is more heavily doped than the body zone 12, is optionally provided between the body zone 12 and the isolation layer 71.

In this component, starting from the front face 101, the source electrode 55 extends through the source zone 15 and the body zone 12, and possibly the more heavily doped zone 16, to the isolation layer 71. By way of example, the isolation 71 is a so-called SIMOX layer, which is produced by oxygen implantation. A further zone 17 of the second conductance type is optionally provided underneath this isolation layer. Fundamentally, this layer 17 is used to keep minority charge carriers from the drift zone 11 away from the isolation layer 71. This layer 17 is p-doped if the drift zone is n-doped, and is used to keep holes from the drift zone 17 away from the isolation layer 71. The recombination rate at the boundary surface between the semiconductor material and the isolation layer 71 is increased, so that holes from the drift zone 11 would quickly recombine with electrons there. This should be avoided if the drift zone 11 is to have good conductivity.

In a manner which will not be described in any more detail, the component preferably has a plurality of such SOI-IGBT cells, with semiconductor zones 19 of the second conductance type in each case being arranged between two such cells in the lateral direction, and preferably not being connected to a defined potential, that is to say such that they float. A further semiconductor zone 19' of the second conductance type is arranged between the edge structure and that SOI-IGBT cell which is arranged closest to the edge structure 20, and this further semiconductor zone 19' can either likewise be arranged such that it is floating, or may be at the same potential as the source electrode 54, as is illustrated by dashed-dotted lines in FIG. 7.

With reference to FIG. 7, it should now also be noted that it is possible to arrange a semiconductor zone 18 of the first conductance type at least in places around one or more of the third semiconductor zones, with this semiconductor zone 18 being more heavily doped than the first semiconductor zone 11 or drift zone. In the example, one such further semiconductor zone 18 is arranged around the third semiconductor zone 33C of the dielectric trench 31C which is arranged furthest away from the transistor structure.

The invention claimed is:

1. A semiconductor component comprising:
a semiconductor body having a first and a second face,
a first semiconductor zone of a first conductance type, at least one second semiconductor zone of a second conductance type, and a semiconductor junction formed therebetween running substantially parallel to the first face,
an edge structure laterally adjacent to the second semiconductor zone and including at least one trench, the at least one trench extending in a vertical direction into the semiconductor body and being filled with a dielectric, the edge structure further including at least one third semiconductor zone of the second conductance type, which, at least partially, is adjacent to a face of the at least one trench which faces away from the first face, the edge structure further including a fourth semiconductor zone, which is more heavily doped than the first semiconductor zone, proximate to the first face; and
a passivation layer supported on the first face at least in an area proximate to the edge structure, the passivation layer extending over the at least one trench.

2. The semiconductor component of claim 1, wherein the semiconductor body has an edge extending vertically between the first and the second face, and wherein the edge structure is disposed between the semiconductor junction and the edge.

3. The semiconductor component of claim 1, wherein the edge structure further comprises:
a plurality of laterally spaced apart trenches, and
a plurality of third semiconductor zones of the second conductance type, each adjacent to one of the trenches.

4. The semiconductor component of claim 3, wherein a distance between two adjacent trenches of the plurality of laterally spaced apart trenches is less than a depth to which at least one of the plurality of laterally spaced apart trenches extend in the vertical direction.

5. The semiconductor component of claim 3, wherein each of the plurality of laterally spaced apart trenches extend at least approximately the same distance in the vertical direction into the semiconductor body.

6. The semiconductor component of claim 1 wherein the at least one trench is directly adjacent to the second semiconductor zone.

7. The semiconductor component of claim 1, wherein the at least one trench extends further into the semiconductor body in the vertical direction, starting from the first face, than the second semiconductor zone.

8. The semiconductor component of claim 1, further comprising a further zone of the first conductance type adjacent to the first semiconductor zone, the further zone more heavily doped than the first semiconductor zone.

9. The semiconductor component of claim 1, wherein the first semiconductor zone forms a drift zone of a MOS transistor, and the second semiconductor zone forms a body zone, comprising:
a source zone of the first conductance type, the source zone arranged such that the body zone is disposed between the source zone and the drift zone,
a drain zone adjacent to the drift zone, the drain zone more heavily doped than the drift zone,
at least a first gate electrode which is arranged adjacent to the body zone.

10. The semiconductor component of claim 9, in which the gate electrode is arranged in a trench that extends from the first face into the semiconductor body.

11. The semiconductor component of claim 9, wherein the drain zone has complementary doping to that of the drift zone.

12. The semiconductor component of one of claim 9, wherein the drain zone is of the same conductance type as the drift zone.

13. The semiconductor component of one of claim 9, wherein an isolation layer is arranged at least partly between the drift zone and the body zone.

14. An arrangement for use in a semiconductor component comprising:
a semiconductor body having a first and a second face, a first semiconductor zone of a first conductance type, at least one second semiconductor zone of a second conductance type, and a semiconductor junction formed therebetween running substantially parallel to the first face,
an edge structure laterally adjacent to the second semiconductor zone and including at least one trench, the at least one trench extending in a vertical direction into the semiconductor body and being filled with a dielectric material, the edge structure further including at least one third semiconductor zone of the second conductance type, which, at least partially, is adjacent to a face of the at least one trench which faces away from the first face, the edge structure further including a fourth semiconductor zone of the first conductance type, which is more heavily doped than the first semiconductor zone, proximate to the first face, and
a passivation layer supported on the first face at least in an area proximate to the edge structure, the passivation layer extending over the at least one trench.

15. The arrangement of claim 14, wherein the semiconductor body includes an edge extending vertically between the first and the second face, and wherein the edge structure is disposed at least in part between the semiconductor junction and the edge.

16. The arrangement of claim 14, wherein the edge structure further comprises:

a plurality of laterally spaced apart trenches, and
a plurality of third semiconductor zones of the second conductance type, each adjacent to one of the trenches.

17. The arrangement of claim 16, wherein a distance between two adjacent trenches of the plurality of laterally spaced apart trenches is less than a depth to which at least one of the plurality of laterally spaced apart trenches extend in the vertical direction.

18. The arrangement of claim 14, wherein the at least one trench is directly adjacent to the second semiconductor zone.

19. The arrangement of claim 14, wherein the at least one trench extends further into the semiconductor body in the vertical direction, starting from the first face, than the second semiconductor zone.

* * * * *